United States Patent [19]

Wood et al.

[11] Patent Number: 4,801,560
[45] Date of Patent: Jan. 31, 1989

[54] SEMICONDUCTOR PROCESSING UTILIZING CARBON CONTAINING THICK FILM SPIN-ON GLASS

[75] Inventors: Thomas E. Wood, Chandler; Henry G. Hughes, Scottsdale, both of Ariz.

[73] Assignee: Motorola Inc., Schaumburg, Ill.

[21] Appl. No.: 103,770

[22] Filed: Oct. 2, 1987

[51] Int. Cl.$^4$ ............... H01L 21/441; H01L 21/473
[52] U.S. Cl. .................... 437/195; 437/231
[58] Field of Search ................ 437/195, 231

[56] References Cited

U.S. PATENT DOCUMENTS 4,723,978 2/1988 Clodgo et al. ............... 156/643

FOREIGN PATENT DOCUMENTS

| 0010231 | 1/1982 | Japan | 437/231 |
| 0100748 | 6/1982 | Japan | 437/195 |
| 0170550 | 10/1982 | Japan | 437/195 |
| 0037150 | 2/1985 | Japan | 437/195 |
| 0175439 | 9/1985 | Japan | 437/195 |
| 0180458 | 8/1986 | Japan | 437/231 |
| 0180143 | 9/1985 | Jordan | 437/195 |

OTHER PUBLICATIONS

Butherus et al., J. Vac. Sci. Technol. B3(5), (Sep./Oct. 1985), pp. 1352-1356.

*Primary Examiner*—Olik Chaudhuri
*Attorney, Agent, or Firm*—Joe E. Barbee; Raymond J. Warren

[57] ABSTRACT

Described is a process of utilizing carbon containing thick film spin-on glass with a directional etching process, such as RIE, or a downstream etching mechanism. As a layer of photoresist is etched from the surface of the spin-on glass, a skin layer of carbonless glass results. The skin layer protects the remaining glass from having the carbon removed allowing the use of spin-on glass on the order of 10,000 Angstroms thick.

20 Claims, 3 Drawing Sheets

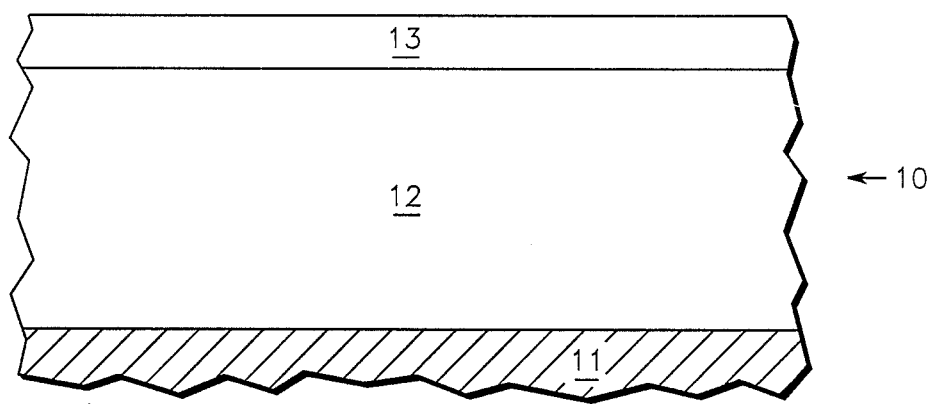
FIG. 1
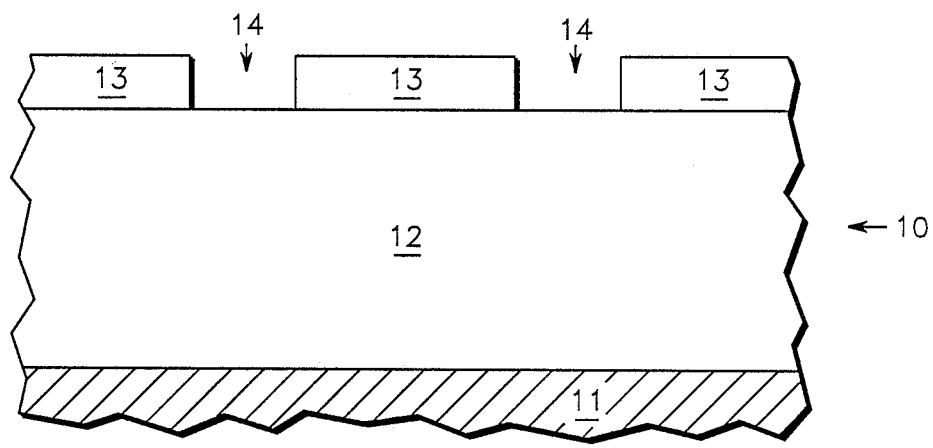
FIG. 2
FIG. 3
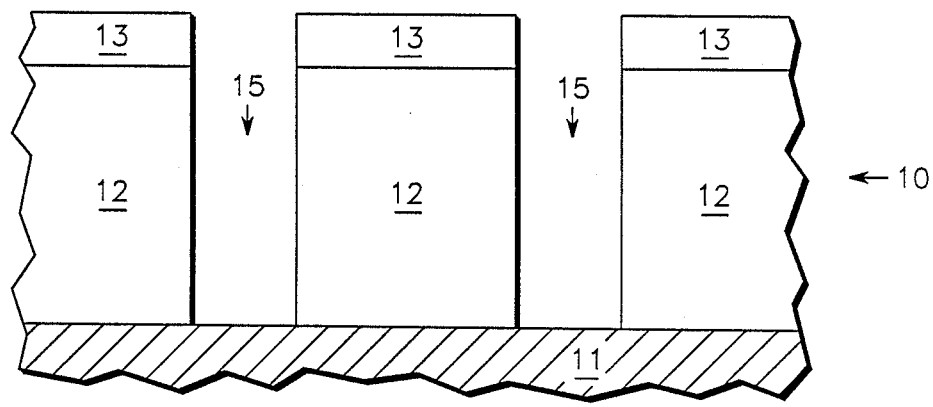

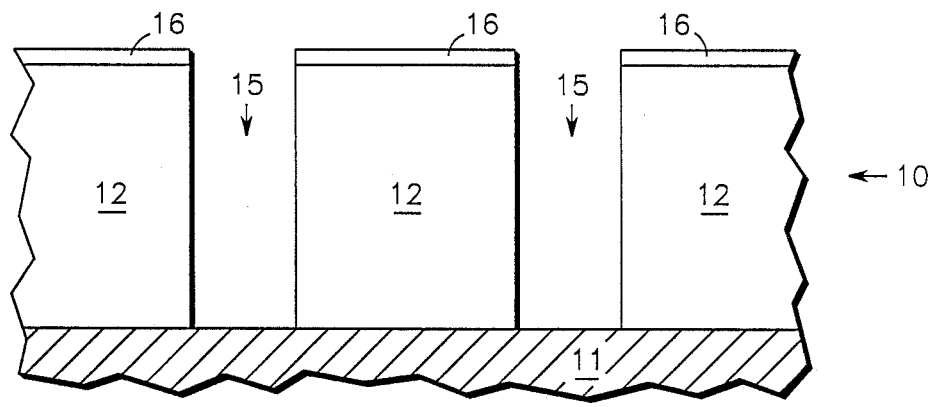
FIG. 4
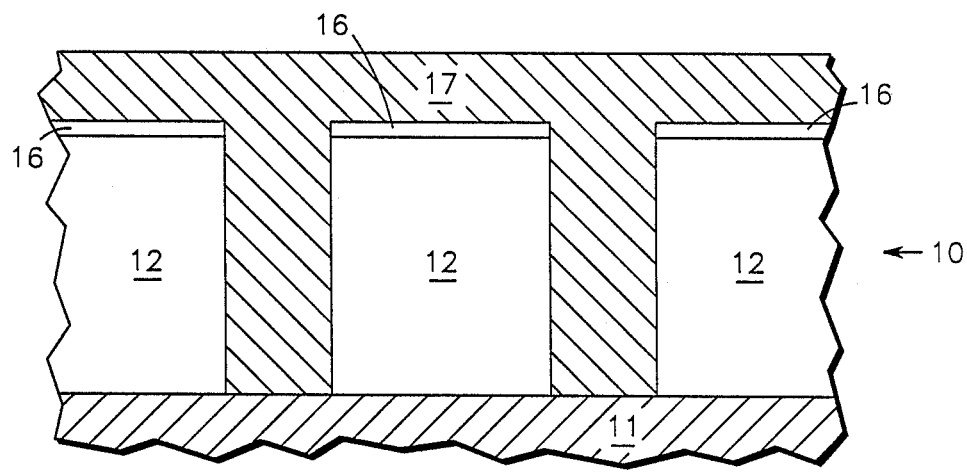
FIG. 5
FIG. 6
—PRIOR ART—
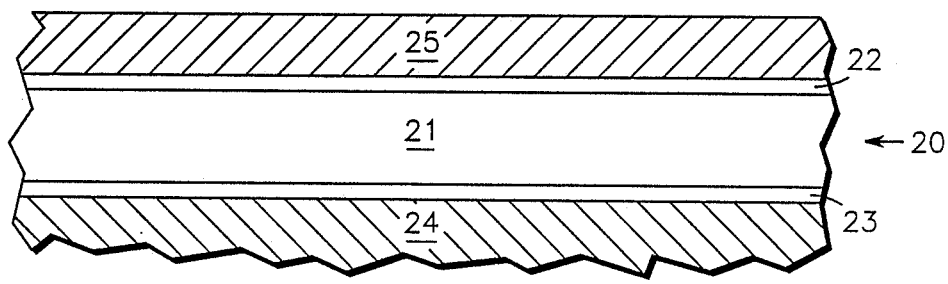

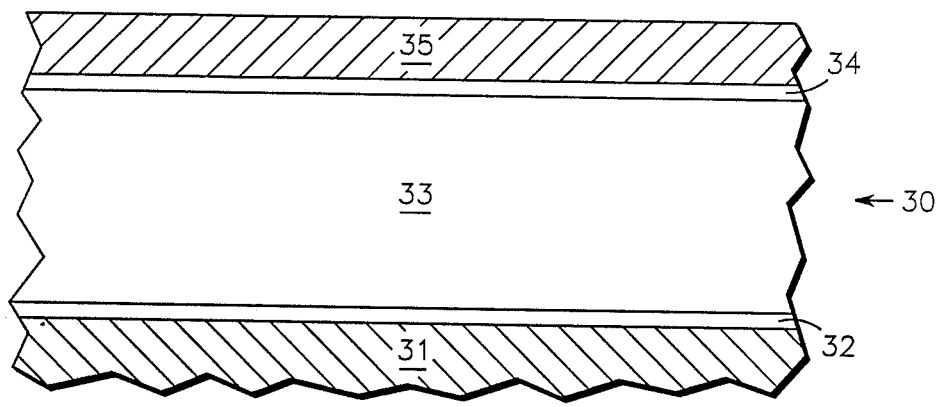
FIG. 7
FIG. 8
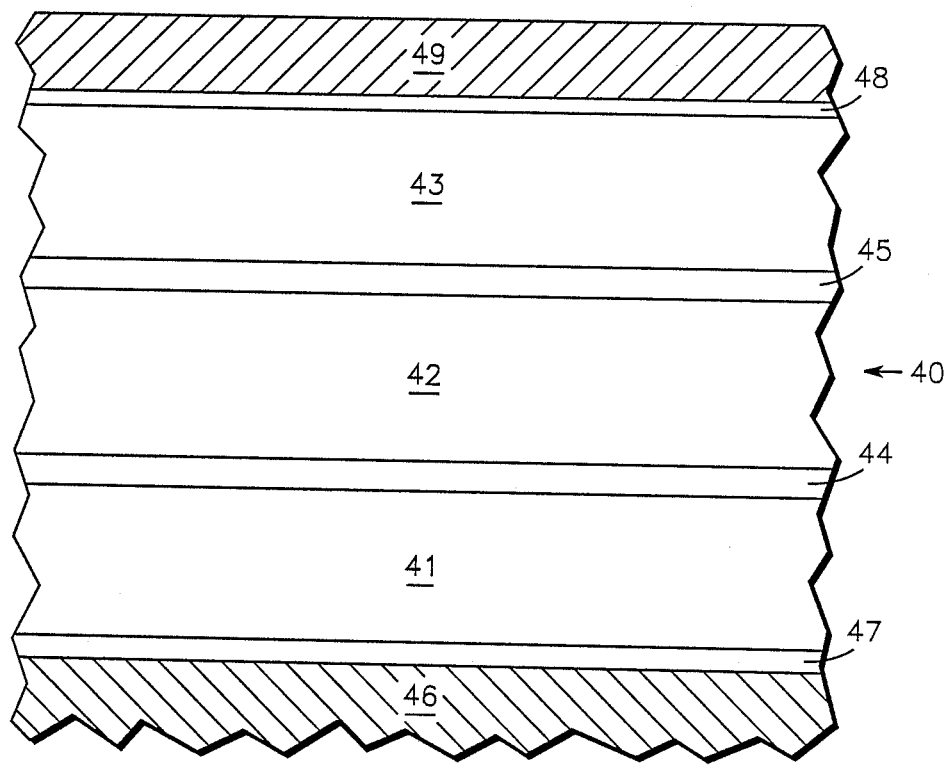

SEMICONDUCTOR PROCESSING UTILIZING CARBON CONTAINING THICK FILM SPIN-ON GLASS

BACKGROUND OF THE INVENTION

The present invention relates, in general, to semiconductor processing and, more particularly, to semiconductor processing utilizing thick film spin-on glass (SOG).

The use of spin-on glass is well known in the art of semiconductor processing but is limited in usable thickness. Presently, the maximum thickness utilized for spin-on glass is approximately 2000 Angstroms. Using films thicker than this cause the glass layer to become highly stressed and result in cracks developing during processing. If a thicker glass layer is desired, it would have to be put down in multiple layers separated by chemical vapor deposition (CVD) oxide. Even with using multiple layers, it has been found that the maximum thickness is 4000 Angstroms, or two layers of 2000 Angstroms each separated by the CVD layer. The reason for this limitation is that the lower SOG layer cannot support more than one more SOG layer during processing.

Therefore, it is an object of the present invention to provide a process of forming semiconductors that overcomes the above deficiencies.

A further object of the present invention is to provide a process of utilizing spin-on glass in semiconductor processing that permits use of thick films.

Another object of the present invention is to provide a process of utilizing spin-on glass in semiconductor processing that will permit the use of more than two layers of spin-on glass.

The above and other objects and advantages of the present invention are provided by the process described herein.

SUMMARY OF THE INVENTION

A particular embodiment of the present invention consists of utilizing a spin-on glass which contains carbon with a directional etching process such as RIE (Reactive Ion Etching) or a downstream, plasma etching mechanism. As a layer of photoresist is etched from the surface of the spin-on glass, a protective skin layer of silicon dioxide is developed on the surface of the spin-on glass. This skin layer is the result of the removal of carbon from a surface portion of the spin-on glass. The skin layer serves to protect the remaining portion of the spin-on glass leaving the carbon in place and providing a stronger, more crack resistant glass layer.

BRIEF DESCRIPTION OF THE DRAWINGS

FIGS. 1-5 are cross sectional views of process flow steps for a process embodying the present invention;

FIG. 6 is a cross sectional view of a portion of a semiconductor device developed with a prior art process;

FIG. 7 is a cross sectional view of a portion of a semiconductor device developed with a process embodying the present invention; and FIG. 8 is a cross sectional view of a portion of a semiconductor device developed with a process embodying the present invention.

DETAILED DESCRIPTION OF THE DRAWINGS

Referring first to FIGS. 1-5, cross sectional views of the process flow steps of a semiconductor processing technique embodying the present invention are illustrated. In FIG. 1, the upper layer(s) of a semiconductor device 10 is illustrated having a metal layer 11, a spin-on glass which contains carbon layer 12, and a photoresist layer 13. Spin-on glass 12 is of a thickness up to approximately 10,000 Angstroms thick.

Next, photoresist layer 13 is masked and developed to form openings 14 therein. Photoresist 13 is then used as a mask while the underlying spin-on glass layer 12 is etched. This etching is of a type, such as fluorine or the like, that will etch the exposed glass without damaging the remaining glass. As illustrated in FIG. 3, the etching process forms vias, or similar openings, 15 in layer 12.

Once vias 15 have been formed, the remaining photoresist 13 must be removed. In a standard barrel asher, photoresist 13 is removed with the use of oxygen. This has the adverse effect of also causing a substantial portion of the carbon in spin-on glass layer 12 to be removed. Without the carbon, spin-on glass layer 12 becomes highly stressed and easily cracked, an undesirable feature.

To avoid the problem of cracking, an RIE type etching is utilized. RIE etching also uses oxygen, or other gases, to perform the etching process, however, in RIE the etching is a directional type etching. This is used to form a thin skin layer 16 at the surface of spin-on glass layer 12. This skin layer 16 is formed by the removal of the carbon in the surface of the glass forming a silicon dioxide ($SiO_2$) network. Skin layer 16 serves to protect the underlying portions of glass 12 leaving the carbon intact. Skin layer 16 is commonly referred to as "top skin" because carbon is removed from the top surface of spin-on glass layer 12.

Alternatively, a downstream etching mechanism utilizing a mixture of oxygen and fluorocarbon gas can be used to remove the photoresist without damaging the carbon containing spin-on glass layer. This is accomplished in the same manner as above in that a protective skin layer of $SiO_2$ is formed during the etching process.

Referring now to FIG. 5, the upper layer of a portion of a semiconductor 10 is illustrated having an additional metal layer 17 disposed on the surface of skin layer 16. This metal would also fill vias 15 and make interconnections between metal layers 11 and 17.

Referring now to FIG. 6, a prior art upper layer of a portion of a semiconductor 20 is illustrated. Upper layer of semiconductor 20 illustrates the prior art use of having a layer of spin-on glass 21 disposed between two layers, 22 and 23, of CVD. CVD layers 22 and 23 are used to couple metal layers 24 and 25 to glass layer 21. These are required in the prior art because of the poor adhesion between glass 21 and metal layers 24 and 25.

The process embodying the present invention can eliminate the requirement of at least one layer of CVD oxide. As shown in FIG. 7, a portion of a semiconductor device 30 is illustrated having a first metal layer 31, a CVD oxide layer 32, and a spin-on glass which contains carbon layer 33. At this stage in the processing, the photoresist has been removed causing a skin layer 34 to be formed on the surface of glass 33. This skin layer 33 is more receptive to bonding glass 33 to a top metal layer 35 thereby eliminating the need for a second CVD layer as required in the prior art.

Alternatively, this process could be used as a premetal layer. As a premetal layer, layer 31 would be any premetal substrate layer of semiconductor 30. Layers 32 and 33 would then be set down as previously described. In opening the vias, or the like, to underlying layer 31, skin layer 34 would be formed during the RIE or downstream etch. A first metal layer 35 would then be deposited and make contact with preohmic portions of substrate 31.

Referring now to FIG. 8, a portion of a semiconductor device 40 is illustrated having more than two layers of spin-on glass. In the prior art, because of the processing, the maximum number of layers of glass that is obtainable with any type of consistency is two layers of 2000 Angstrom glass. As illustrated in FIG. 8, three layers, 41, 42, and 43, of spin-on glass which contains carbon are illustrated. Glass layers 41 and 42 are coupled by a CVD layer 44; and glass layers 42 and 43 are coupled by a CVD layer 45. The bottom glass layer 41 is then coupled to a metal layer 46 by a third CVD layer 47. As shown, the photoresist layer has already been removed leaving a carbonless skin layer 48 at the surface of glass 43. A top metal layer 49 is then disposed on the surface of skin layer 48. This provides up to 30,000 Angstroms of glass between metal layers as opposed to the 4000 Angstroms previously available. It should be noted here that the present process is not limited to three layers of glass but may contain more.

In addition to the above, it would be possible to eliminate CVD layers 44 and 45 and have glass layers 41, 42 and 43 contact each other directly. This is again possible due to the protection of skin layer 48. By protecting the lower layers, the carbon remains in most of the glass and allows an improved stress free bonding between layers. Without the carbon, the layers do not bond as well and the CVD layers are required.

Thus, it will be apparent to one skilled in the art, following a review of the above specification, that there has been provided in accordance with the invention, a device and method that fully satisfies the objects, aims and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A method of producing semiconductor devices comprising the steps of:
    providing a substrate;
    depositing a first layer of spin-on glass which contains carbon on a surface of said substrate;
    depositing a layer of photoresist on a surface of said first layer of spin-on glass which contains carbon;
    masking and developing said photoresist;
    etching through said first layer of spin-on glass which contains carbon in an area defined by said photoresist to said substrate;
    removing said layer of photoresist utilizing a directional etching mechanism; and
    removing carbon from a top skin of said first layer of spin-on glass which contains carbon.

2. The method of claim 1 wherein said substrate is a metal.

3. The method of claim 1 wherein said first layer of spin-on glass which contains carbon has a thickness between approximately 2500 Angstroms and 10,000 Angstroms.

4. The method of claim 1 wherein said directional etching mechanism is a reactive ion etching mechanism.

5. The method of claim 1 further comprising the step of depositing a first layer of chemical vapor deposited oxide on said substrate between said substrate and said first layer of spin-on glass which contains carbon.

6. The method of claim 5 further comprising the steps of:
    depositing a second layer of spin-on glass which contains carbon on said first layer of chemical vapor deposited oxide between said first layer of chemical vapor deposited oxide and said first layer of spin-on glass which contains carbon;
    depositing a second layer of chemical vapor deposited oxide on said second layer of spin-on glass which contains carbon between said first and second layers of spin-on glass which contains carbon;
    depositing a third layer of spin-on glass which contains carbon on said second layer of chemical vapor deposited oxide between said second layer of chemical vapor deposited oxide and said first layer of spin-on glass which contains carbon; and
    depositing a third layer of chemical vapor deposited oxide on said third layer of spin-on glass which contains carbon between said first and third layers of spin-on glass which contains carbon.

7. A method of producing semiconductor devices comprising the steps of:
    providing a substrate;
    depositing a first layer of spin-on glass which contains carbon on a surface of said substrate;
    depositing a layer of photoresist on a surface of said first layer of spin-on glass which contains carbon;
    masking and developing said photoresist;
    etching through said first layer of spin-on glass which contains carbon in an area defined by said photoresist to said substrate;
    removing said layer of photoresist utilizing a downstream etching mechanism; and
    removing carbon from a top skin of said first layer of spin-on glass which contains carbon.

8. The method of claim 7 wherein said substrate is a metal.

9. The method of claim 7 wherein said first layer of spin-on glass which contains carbon has a thickness between approximately 2500 Angstroms and 10,000 Angstroms.

10. The method of claim 7 further comprising the step of depositing a first layer of chemical vapor deposited oxide on said substrate between said substrate and said first layer of spin-on glass which contains carbon.

11. The method of claim 10 further comprising the steps of:
    depositing a second layer of spin-on glass which contains carbon on said first layer of chemical vapor deposited oxide between said first layer of chemical vapor deposited oxide and said first layer of spin-on glass which contains carbon;
    depositing a second layer of chemical vapor deposited oxide on said second layer of spin-on glass which contains carbon between said first and second layers of spin-on glass which contains carbon;
    depositing a third layer of spin-on glass which contains carbon on said second layer of chemical vapor deposited oxide between said second layer of chemical vapor deposited oxide and said first layer of spin-on glass which contains carbon; and depositing a third layer of chemical vapor deposited oxide on said third layer of spin-on glass which contains carbon between said first and third layers of spin-on glass which contains carbon.

12. A method of producing semiconductor devices comprising the steps of:
providing a first metal layer on a substrate;
depositing a first layer of chemical vapor deposited oxide on a surface of said first metal layer;
depositing a first layer of spin-on glass which contains carbon on a surface of said first layer of chemical vapor deposited oxide;
depositing a layer of photoresist on a surface of said first layer of spin-on glass which contains carbon;
masking and developing said photoresist;
etching through said first layer of spin-on glass which contains carbon in an area defined by said photoresist to said substrate;
removing said layer of photoresist utilizing a directional etching mechanism;
removing carbon from a top skin of said spin-on glass which contains carbon; and
depositing a second metal layer on said top skin of said first layer of spin-on glass which contains carbon.

13. The method of claim 12 wherein said first layer of spin-on glass which contains carbon has a thickness between approximately 2500 Angstroms and 10,000 Angstroms.

14. The method of claim 12 wherein said directional etching mechanism is a reactive ion etching mechanism.

15. The method of claim 12 further comprising the steps of:
depositing a second layer of spin-on glass which contains carbon on said first layer of chemical vapor deposited oxide between said first layer of chemical vapor deposited oxide and said first layer of spin-on glass which contains carbon;
depositing a second layer of chemical vapor deposited oxide on said second layer of spin-on glass which contains carbon between said first and second layers of spin-on glass which contains carbon;
depositing a third layer of spin-on glass which contains carbon on said second layer of chemical vapor deposited oxide between said second layer of chemical vapor deposited oxide and said first layer of spin-on glass which contains carbon; and
depositing a third layer of chemical vapor deposited oxide on said third layer of spin-on glass which contains carbon between said first and third layers of spin-on glass which contains carbon.

16. A method of producing semiconductor devices comprising the steps of:
providing a first metal layer on a substrate;
depositing a first layer of chemical vapor deposited oxide on a surface of said first metal layer;
depositing a first layer of spin-on glass which contains carbon on a surface of said first layer of chemical vapor deposited oxide;
depositing a second layer of chemical vapor deposited oxide on said first layer of spin-on glass which contains carbon;
depositing a second layer of spin-on glass which contains carbon on said second layer of chemical vapor deposited oxide;
depositing a third layer of chemical vapor deposited oxide on said second layer of spin-on glass which contains carbon;
depositing a third layer of spin-on glass which contains carbon on said third layer of chemical vapor deposited oxide;
depositing a layer of photoresist on a surface of said third layer of spin-on glass which contains carbon;
masking and developing said photoresist;
etching said first, second and third layers of spin-on glass which contains carbon and said first, second and third layers of said chemical vapor deposited oxide in an area defined by said photoresist;
removing said layer of photoresist utilizing a directional etching mechanism;
removing carbon from a top skin of said third layer of spin-on glass which contains carbon; and
depositing a second metal layer on said top skin of said third layer of spin-on glass which contains carbon.

17. The method of claim 16 wherein said first, second and third layers of spin-on glass which contains carbon have a thickness between approximately 2500 Angstroms and 10,000 Angstroms.

18. The method of claim 16 wherein said directional etching mechanism is a reactive ion etching mechanism.

19. A method of producing semiconductor devices comprising the steps of:
providing a first metal layer on a substrate;
depositing a first layer of chemical vapor deposited oxide on a surface of said first metal layer;
depositing a first layer of spin-on glass which contains carbon on a surface of said first layer of chemical vapor deposited oxide;
depositing a second layer of chemical vapor deposited oxide on said first layer of spin-on glass which contains carbon;
depositing a second layer of spin-on glass which contains carbon on said second layer of chemical vapor deposited oxide;
depositing a third layer of chemical vapor deposited oxide on said second layer of spin-on glass which contains carbon;
depositing a third layer of spin-on glass which contains carbon on said third layer of chemical vapor deposited oxide;
depositing a layer of photoresist on a surface of said third layer of spin-on glass which contains carbon;
masking and developing said photoresist;
etching said first, second and third layers of spin-on glass which contains carbon and said first, second and third layers of said chemical vapor deposited oxide in an area defined by said photoresist;
removing said layer of photoresist utilizing a downstream etching mechanism;
removing carbon from a top skin of said third layer of spin-on glass which contains carbon; and
depositing a second metal layer on said top skin of said third layer of spin-on glass which contains carbon.

20. The method of claim 19 wherein said first, second and third layers of spin-on glass which contains carbon have a thickness between approximately 2500 Angstroms and 10,000 Angstroms.

* * * * *